US012660303B2

(12) United States Patent
Koeppl et al.

(10) Patent No.: US 12,660,303 B2
(45) Date of Patent: Jun. 16, 2026

(54) HIGH CURRENT POWER MODULE PACKAGE WITH LINEAR OPERATION CAPABILITIES AND SENSING CAPABILITIES

(71) Applicant: Infineon Technologies AG, Neubiberg (DE)

(72) Inventors: Benno Koeppl, Markt Indersdorf (DE); Andre Mourrier, Manosque (FR); Sebastian Thunich, Munich (DE); David Jacquinod, La Fare les oliviers (FR); Stefan Schumi, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 731 days.

(21) Appl. No.: 18/058,031

(22) Filed: Nov. 22, 2022

(65) Prior Publication Data

US 2024/0170482 A1    May 23, 2024

(51) Int. Cl.
H10D 84/80 (2025.01)
H03K 17/687 (2006.01)
(Continued)

(52) U.S. Cl.
CPC .......... H10D 84/813 (2025.01); H10W 72/50 (2026.01); H10W 74/111 (2026.01); H10W 74/47 (2026.01); H03K 17/6871 (2013.01)

(58) Field of Classification Search
CPC ............. H03K 17/6871; H03K 17/145; H03K 17/122; H03K 17/687; H03K 17/0822; H03K 17/063; H03K 17/6877; H03K 2017/307; H03K 17/08122; H03K 2217/0036; H03K 5/24; H03K 17/302; H03K 17/165; H03K 2217/0054; H03K 2217/0063; H03K 2217/0081; H03K 17/102; H03K 17/06; H03K 17/16; H03K 17/6874; H03K 17/08104; H03K 17/133; H03K 17/693; H03K 2217/0027;
(Continued)

(56) References Cited

U.S. PATENT DOCUMENTS 6,362,655 B1 * 3/2002 Abraham ........... H03K 19/0005
                                                       327/108
6,768,382 B1 * 7/2004 Shie ........................ H03F 1/301
                                                       330/296
(Continued)

OTHER PUBLICATIONS

U.S. Appl. No. 17/810,163, filed Jun. 30, 2022, naming inventors Ahlers et al.

*Primary Examiner* — John W Poos
(74) *Attorney, Agent, or Firm* — Shumaker & Sieffert, P.A.

(57) ABSTRACT

A power module package may comprise a first metal oxide semiconductor field effect transistor (MOSFET), wherein the first MOSFET is configured to operate in a linear mode of operation when the first MOSFET is ON; a second MOSFET, wherein the second MOSFET is configured to operate in a non-linear mode of operation when the second MOSFET is ON, and wherein the first MOSFET and the second MOSFET are arranged in parallel; and a third MOSFET, wherein the third MOSFET is arranged to perform one or more sensing operations. The first MOSFET, the second MOSFET, and the third MOSFET may be arranged within a molding compound of the power module package.

23 Claims, 9 Drawing Sheets

(51) Int. Cl.
*H10W 72/50*        (2026.01)
*H10W 74/10*        (2026.01)
*H10W 74/47*        (2026.01)

(58) Field of Classification Search
CPC ....... H03K 17/04123; H03K 17/04163; H03K 17/08142; H03K 19/0013; H03K 19/0016; H03K 2217/0072; H03K 3/011; H03K 17/162; H03K 17/163; H03K 17/689; H03K 17/785; H03K 19/00315; H03K 19/017509; H03K 19/018514; H03K 2005/00013; H03K 3/037; H03K 3/3565; H03K 2217/0009; H03K 17/08; H03K 17/161; H03K 17/164; H03K 17/167; H03K 17/18; H03K 17/567; H03K 17/6872; H03K 17/78; H03K 19/00384; H03K 19/018507; H03K 2217/0018; H03K 3/01; H03K 3/57; H03K 17/082; H03K 19/0005; H03K 19/018521; H03K 19/018578; H03K 19/0944; H03K 19/09443; H03K 19/20; H03K 2017/066; H03K 2017/6878; H03K 2217/009; H03K 5/05; H03K 17/168; H03K 19/0952; H03K 2217/94031; H03K 3/0231; H03K 3/353; H03K 5/01; H03K 5/12; H03K 17/002; H03K 17/04206; H03K 17/081; H03K 19/0185; H03K 19/018528; H03K 19/09403; H03K 19/173; H03K 3/012; H03K 3/0315; H03K 3/354; H03K 5/086; H03K 5/131; H03K 5/133; H03K 5/2481; H03K 7/06; H03K 17/14; H03K 17/223; H03K 17/6264; H03K 17/74; H03K 19/0019; H03K 19/01707; H03K 19/017518; H03K 19/018; H03K 19/018535; H03K 19/08; H03K 19/094; H03K 19/0941; H03K 19/09425; H03K 19/09448; H03K 19/0963; H03K 19/21; H03K 2005/00045; H03K 2005/00071; H03K 2005/00078; H03K 2005/00202; H03K 2005/00208; H03K 3/28; H03K 3/356017; H03K 4/62; H03K 5/003; H03K 5/08; H03K 5/13; H03K 5/1536; H03K 5/2418; H03K 5/2445; H03K 7/08

See application file for complete search history.

(56)                References Cited

U.S. PATENT DOCUMENTS

| | | | |
|---|---|---|---|
| 11,658,658 B2 * | 5/2023 | Das | H03K 17/08122<br>327/581 |
| 2003/0090314 A1 * | 5/2003 | Kronmueller | G05F 3/262<br>327/543 |
| 2006/0087345 A1 * | 4/2006 | Schoenbauer | H03H 11/405<br>326/119 |

* cited by examiner

CONTROL POWER MODULE PACKAGE TO DEFINE LINEAR OPERATION ⟋1201

CONTROL POWER MODULE PACKAGE TO DEFINE HIGH CURRENT OPERATION FOLLOWING LINEAR OPERATION ⟋1202

CONTROL POWER MODULE PACKAGE TO DEFINE SENSING OPERATION DURING HIGH CURRENT OPERATION ⟋1203

HIGH CURRENT POWER MODULE PACKAGE WITH LINEAR OPERATION CAPABILITIES AND SENSING CAPABILITIES

TECHNICAL FIELD

This disclosure relates to transistors that may be used as power switches, and more specifically, metal-oxide semiconductor field effect transistors (MOSFETs).

BACKGROUND

Power switches are used in a wide variety of applications in order to control power being delivered to a load. Metal-Oxide Field Effect Transistors (MOSFETs) are often used as power switches. MOSFETs may be formed in silicon (Si), gallium nitride (GaN), silicon carbide (SiC), or another semiconductor material. Examples of MOSFETs may include, but are not limited to, PMOS, NMOS, DMOS, or any other type of MOSFET, or any combination of the same.

Power switches are typically controlled by one or more driver circuits via a voltage signal applied to the gate of a power switch so as to control on/off switching of the power switch. A microcontroller may provide control signals to the driver circuit(s) to provide system-level control over the power switches.

SUMMARY

This disclosure is directed to a power module circuit package that includes three different metal oxide semiconductor field effect transistors (MOSFETs) arranged to provide different power module operations. A first MOSFET may comprise a so-called LIN-FET configured to operate in a linear mode of operation when the first MOSFET is ON. A second MOSFET may comprise a so-called ON-FET configured to operate in a high-current non-linear mode of operation when the second MOSFET is ON. A third MOSFET may comprise a sensing transistor configured to perform sensing operation. A semiconductor molding compound may encapsulate the semiconductor dies to provide a self-contained circuit package with desirable functionality. Various pins may extend from the molding compound to provide inputs, outputs, and control of the different transistors.

In some examples, this disclosure describes a power module package comprising a first MOSFET, wherein the first MOSFET is configured to operate in a linear mode of operation when the first MOSFET is ON; a second MOSFET, wherein the second MOSFET is configured to operate in a non-linear mode of operation when the second MOSFET is ON, and wherein the first MOSFET and the second MOSFET are arranged in parallel; and a third MOSFET, wherein the third MOSFET is arranged to perform one or more sensing operations. In order to provide a self-contained circuit package, the power module package may also comprise a semiconductor molding compound, wherein the first MOSFET is arranged within the molding compound, wherein the second MOSFET is arranged within the molding compound, and wherein the third MOSFET is arranged within the molding compound.

In some examples, this disclosure describes a circuit comprising a power module package and one or more driver circuits. The power module package may comprise a molding compound; a first MOSFET arranged within the molding compound, wherein the first MOSFET is configured to operate in a linear mode of operation when the first MOSFET is ON; a second MOSFET arranged in the molding compound, wherein the second MOSFET is configured to operate in a non-linear mode of operation when the second MOSFET is ON and wherein the first MOSFET and the second MOSFET are arranged in parallel; and a third MOSFET arranged in the molding compound, wherein the third MOSFET is arranged to perform one or more sensing operations. The one or more driver circuits may be configured to control the first MOSFET, the second MOSFET, and the third MOSFET based on gate voltage signals.

In some examples, this disclosure describes a method that comprises controlling a plurality of transistors of a power module package via gate signals, wherein the power module package comprises: a first MOSFET, wherein the first MOSFET is configured to operate in a linear mode of operation when the first MOSFET is ON; a second MOSFET, wherein the second MOSFET is configured to operate in a non-linear mode of operation when the second MOSFET is ON, and wherein the first MOSFET and the second MOSFET are arranged in parallel; and a third MOSFET, wherein the third MOSFET is arranged to perform one or more sensing operations.

Details of these and other examples are set forth in the accompanying drawings and the description below. Other features, objects, and advantages will be apparent from the description and drawings, and from the claims.

DETAILED DESCRIPTION

This disclosure is directed to a power module circuit package that includes three different metal oxide semiconductor field effect transistor (MOSFETs) arranged to provide different power module operations. In some cases, the different MOSFETs may comprise discrete transistors formed in different semiconductor dies, or in some cases, two or more of the MOSFETs may be formed in the same semiconductor die. In either situation, a semiconductor molding compound may encapsulate the different MOSFETs to provide a self-contained circuit package with desirable functionality.

For example, the power module package may comprise a first MOSFET, wherein the first MOSFET is configured to operate in a linear mode of operation when the first MOS-FET is ON. In addition, the power module package may comprise a second MOSFET, wherein the second MOSFET is configured to operate in a non-linear mode of operation when the second MOSFET is ON, and wherein the first MOSFET and the second MOSFET are arranged in parallel. The presence of the first MOSFET and the second MOSFET positioned in parallel within the molding compound allows for both linear operation and non-linear operation by the power module package.

The first MOSFET, for example, may be useful to deliver linear charge to an output capacitor, and then, the second MOSFET can be turned on in the presence of a pre-charged output capacitor, which may be desirable for the non-linear high current operation of the second MOSFET. A pre-charged output capacitor can reduce or eliminate current dips when the second MOSFET is turned ON in the presence of a load, which may be desirable to promote fast delivery of current when the second MOSFET is turned ON.

In addition to the first and second MOSFETs, the power module package may also include a third MOSFET, wherein the third MOSFET is arranged to perform one or more sensing operations. For example, a sensing mode of operation of the power module package may occur during a high current mode of operation where the second MOSFET is ON and the third MOSFET is ON in order to sense current through the power module package. With three different MOSFETs arranged to provide different power module operations, the circuit package provides desirable functionality that can promote efficient operation, promote safety, and provide sensing capabilities during operation.

Figure 1:
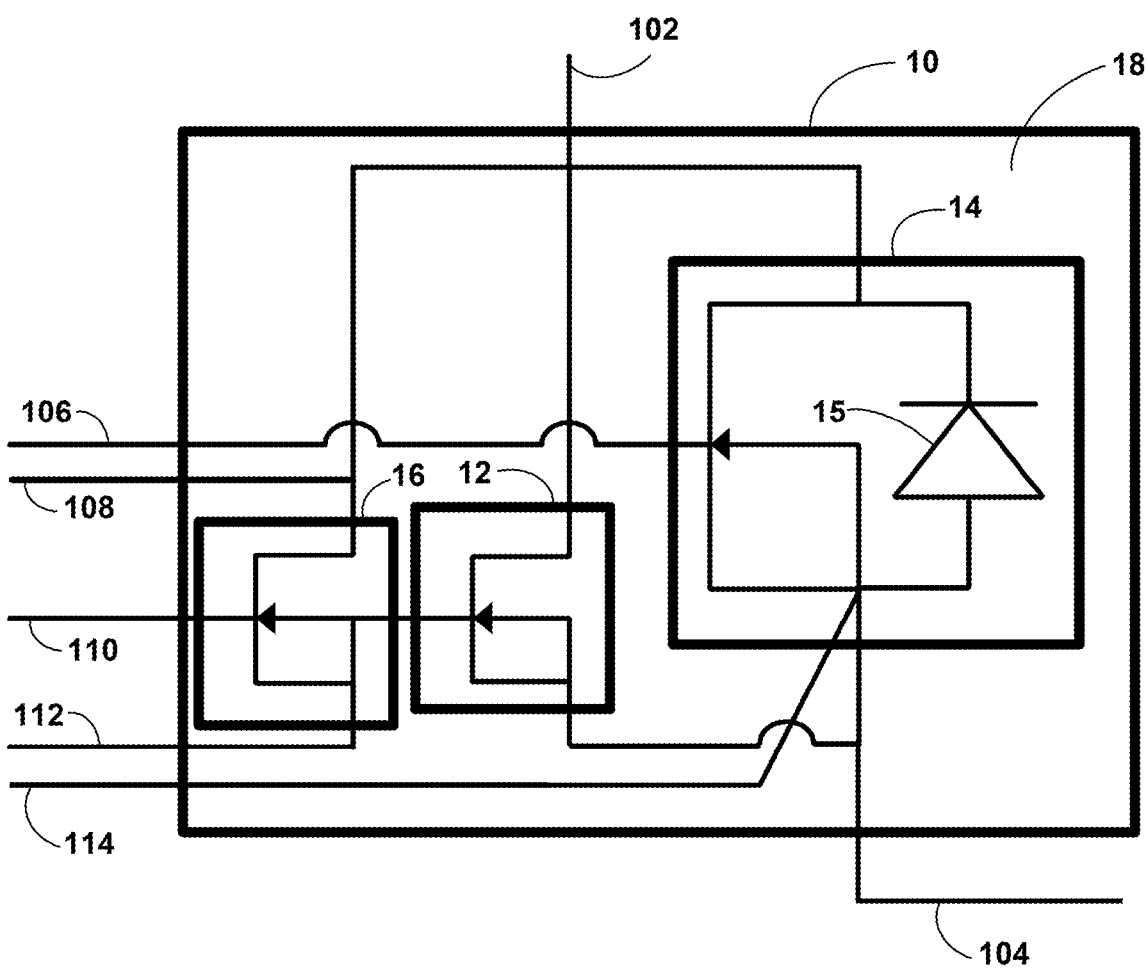
FIGS. 1-3 are circuit diagrams showing some example circuit packages consistent with this disclosure.

FIG. 1 is a circuit diagram showing an example circuit package 10 consistent with this disclosure. In this example, power module package 10 comprises a first MOSFET 12, a second MOSFET 14, and a third MOSFET 16. For example, first MOSFET 12, second MOSFET 14, and third MOSFET 16 may be arranged within a semiconductor molding compound 18. Various pins 102, 104, 106, 108, 110, 112, and 114 may extend from molding compound 18 to provide electrical connections to circuit package 10.

First MOSFET 12 is configured to operate in a linear mode of operation when first MOSFET 12 is ON. In some examples, first MOSFET 12, for example, may be configured as a so-called linear FET that is configured to operate in a current limited, linear mode of operation, e.g., with operational characteristics similar to those of OptiMOS™ Linear FETs commercially available from Infineon Technologies AG headquartered in Neubiberg German. So-called linear FETs, for example, may combine a very low drain-to-source resistance ($R_{DS}$ON) with a wide safe operating area (SOA).

Second MOSFET 14 is configured to operate in a non-linear mode of operation when second MOSFET 14 is ON. First MOSFET 12 and second MOSFET 14 are arranged in parallel within circuit package 10. In contrast to first MOS-FET 12, second MOSFET 14 may be configured as a power MOSFET or so-called "ON-FET" configured to operate in a non-linear mode of operation at low conduction losses. Second MOSFET 14, for example, may be configured with operational characteristics similar to those of power MOS-FETs commercially available from Infineon Technologies AG headquartered in Neubiberg German. So-called power MOSFETs, for example, may comprise PROFET™ power MOSFETs, Automotive qualified OptiMOS™ power MOS-FETs, CoolMOS™ superjunction MOSFETs, N-channel Power MOSFETs, P-Channel Power MOSFETs, small sig-nal power MOSFETs, N-Channel Depletion Mode MOS-FETs, dual MOSFETs, silicon carbide CoolSiC™ MOS-FETS, or other types of power MOSFETS configured to operate as power switches or disconnect switches. With so-called ON-FETs, operation may be linear for a very short period of time when the MOSFET is initially turned on, but operation is generally non-linear when the MOSFET is ON in a steady state high-current delivery mode.

Third MOSFET 16 comprises a sensing element arranged to perform one or more sensing operations. Gate voltage signals from one or more driver circuits (not shown in FIG. 1) may be configured to define: a linear mode of operation of power module 10 where first MOSFET 12 is ON and second MOSFET 14 is OFF, a high current mode of operation of power module 10 where second MOSFET 14 is ON; and a sensing mode of operation of power module during the high current mode of operation where second MOSFET 14 is ON and third MOSFET 16 is ON.

In order to achieve a self-contained power module pack-age 10, a semiconductor molding compound 18 may encap-sulate MOSFETs 12, 14, 14 such that first MOSFET 12 is arranged within molding compound 18, second MOSFET 14 is arranged within molding compound 18, and third MOS-FET 16 is arranged within molding compound 18. Molding compound 18 may comprise any commercially available semiconductor molding compound. For example, molding compound 18 may comprise a fine flied, electrically stable compound used for semiconductor packaging requirements. Molding compound 18 may be electrically stable at high temperatures and may be formed of an epoxy material that graded for semiconductor circuit. Molding compound 18 may cover and protect semiconductor dies associated with MOSFETS 12, 14, 16. In FIG. 1, a body diode 15 of second MOSFET 14 is illustrated. First MOSFET 12 and third MOSFET 16 may also include respective body diodes (not shown in FIG. 1).

As shown in FIG. 1, various pins 102, 104, 106, 108, 110, 112, 114 may extend from molding compound 18 of power module package 18. Pin 102 may comprise a drain pin that is configured to be connected to a current source. Drain pin 102 may define a common drain for first MOSFET 12, second MOSFET 14, and third MOSFET 14, In other words, drain pin 102 may comprise a drain conductor connected to a drain node of first MOSFET 12, connected to a drain node of second MOSFET 14, and connected to a drain node of third MOSFET 16, wherein the drain node of first MOSFET 12, the drain node of second MOSFET 14, and the drain node of third MOSFET 16 comprise a common drain node in molding compound 18. A source pin 104 may define one or more conductors connected to a source node of first MOSFET 12 and connected to a source node of second MOSFET 14, wherein the source node of first MOSFET 12 and the source node of second MOSFET 14 comprise a common source node in molding compound 18. Source pin 104 may be configured to be connected to a load (not shown), and the circuit node associated with the load may also include an output capacitor (not shown) to help with the turn-ON switching of second MOSFET 14. A second source pin 112 may comprise one or more second source conduc-tors connected to a source node of third MOSFET 16. Thus, first MOSFET 12, second MOSFET 14, and third MOSFET 16 share a common drain node, and first MOSFET 12 and second MOSFET 14 share a common source node, while third MOSFET 16 has its own separate source node. An additional source pin 114 may also be included as a so-called "Source Kelvin" pin, which in some examples, may be used for measuring voltages that can be mapped to a junction temperature of first MOSFET 14.

Second source pin 112 and extra drain pin 106 may define sensing pins whereby third MOSFET 16 can be used to sense current via a voltage drop over third MOSFET 16 when second MOSFET 14 is ON and third MOSFET 16 is ON. Gate pins 106 and 110 may comprise control pins for controlling the ON-OFF states of MOSFETS 12, 14, 16. In this example, a first gate pin 110 is associated with first MOSFET 12 and third MOSFET 16, wherein first gate pin 110 is connected to a gate node of first MOSFET 12 and a gate node of third MOSFET 16. Thus, the same gate signal controls first MOSFET 12 and third MOSFET 16 via first gate pin 110. A second gate pin 106 is associated with second MOSFET 14, wherein the second gate pin 106 is connected to a gate node of second MOSFET 16.

According to this disclosure, first MOSFET 12 may comprise a LIN-FET, second MOSFET 14 may comprise an ON-FET, and third MOSFET 16 may comprise a sensing FET. Relatively speaking, second MOSFET 14 may comprise a larger surface area of semiconductor material than first MOSFET 12. Moreover, first MOSFET 12 may comprise a larger surface area of semiconductor material than third MOSFET 12. Thus, relatively speaking, third MOSFET 16 is the smallest transistor in power module 10, and second MOSFET 14 is the largest transistor in power module 10. First MOSFET 12 is smaller than second MOSFET 14 but larger than third MOSFET 16. Consistent with LIN-FET operation vs ON-FET operation, first MOSFET 12 and second MOSFET 14 may define different safe operating areas (SOAs), and first MOSFET 12 and second MOSFET 14 may define different Zero Temperature Coefficients (ZTCs).

Consistent with the illustration in FIG. 1, in some examples, first MOSFET 12, second MOSFET 14, and third MOSFET 16 are discrete devices formed in different semiconductor materials and arranged in molding compound 18.

Figures 2, 3:
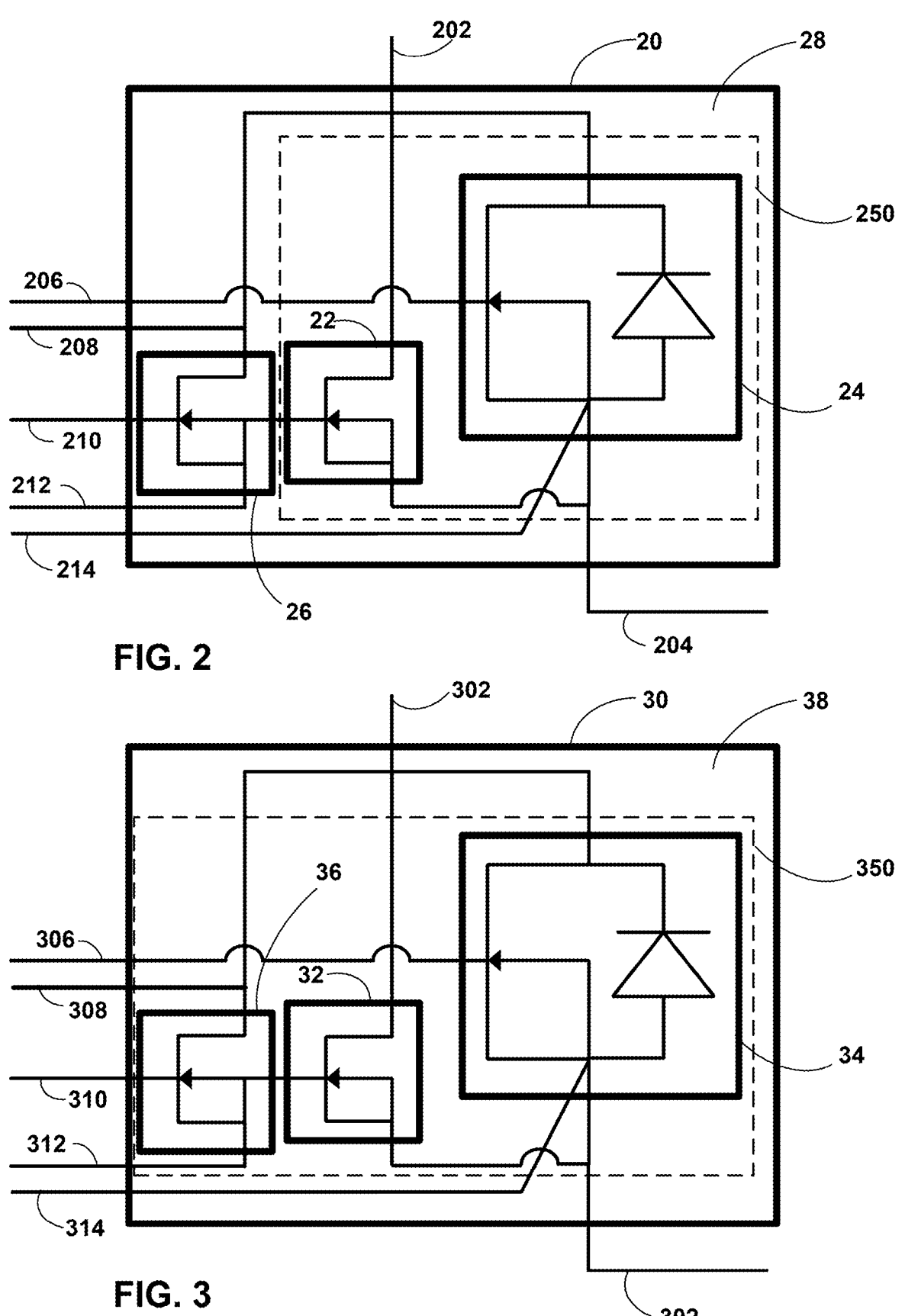

FIG. 2 is another circuit diagram showing an example power module package 20 consistent with this disclosure. In this example, power module package 20 comprises a first MOSFET 22, a second MOSFET 24, and a third MOSFET 26. Power module package 20 is substantially similar to power module package 10 in many respects, and therefore, the similar details will not be repeated. In general, first MOSFET 22 of FIG. 2 is similar to first MOSFET 12 of FIG. 1, second MOSET 24 is similar to second MOSFET 14, and third MOSFET 26 is similar to third MOSFET 16. Molding compound 28 of FIG. 2 is similar to molding compound 18 of FIG. 1, and various pins 202, 204, 206, 208, 210, 212, and 214 are similar respectively to pins 102, 104, 106, 108, 110, 112, and 114.

In contrast to power module package 10 shown in MC, 1, in power module package 20 shown in FIG. 2, first MOSFET 12 and second MOSFET 14 are formed in a common semiconductor material 250, and third MOSFET comprises a discrete device formed in a different semiconductor material. For example, first MOSFET 12 may comprise less than 15 percent of a semiconductor area associated with common semiconductor material 250 and second MOSFET may comprise greater than 85 percent of the semiconductor area associated with common semiconductor material 250.

Forming first MOSFET 22 and second MOSFET 24 in the same semiconductor material 250 may present additional advantages. In this ease, first MOSFET 22 and second MOSFET 24 may define a dual-gate semiconductor device with two separate transistors formed in the same silicon material. The same semiconductor material 250, may comprise silicon, silicon carbide, gallium nitride, or other semiconductor materials. Thus, in various examples, first MOSFET 24 and second MOSFET 22 may comprise silicon MOSFETs, gallium nitride MOSFETS, silicon carbide MOSFETS, or MOSFETs formed in another semiconductor material. Examples of MOSFETs may include, but are not limited to, PMOS, NMOS, DMOS, or any other type of MOSFET, or any combination of the same.

Second MOSFET 22 may be used as a power switch or disconnect switch for connecting power to a load. In such cases, however, there is often a DC link capacitor (also referred to as a "load capacitor"). The DC link capacitor may be connected to the load in order to provide more immediate power to the load when second MOSFET 24 is turned on. In these cases, a pre-charging routine may be performed with regard to the DC link capacitor to ensure that the DC link capacitor has sufficient charge prior to turn-on of second MOSFET 24. In some examples, first MOSFET 22 may provide a useful mechanism for performing the pre-charging routine on the DC link capacitor, e.g., immediately prior to turn on of second MOSFET 24.

Figure 6:
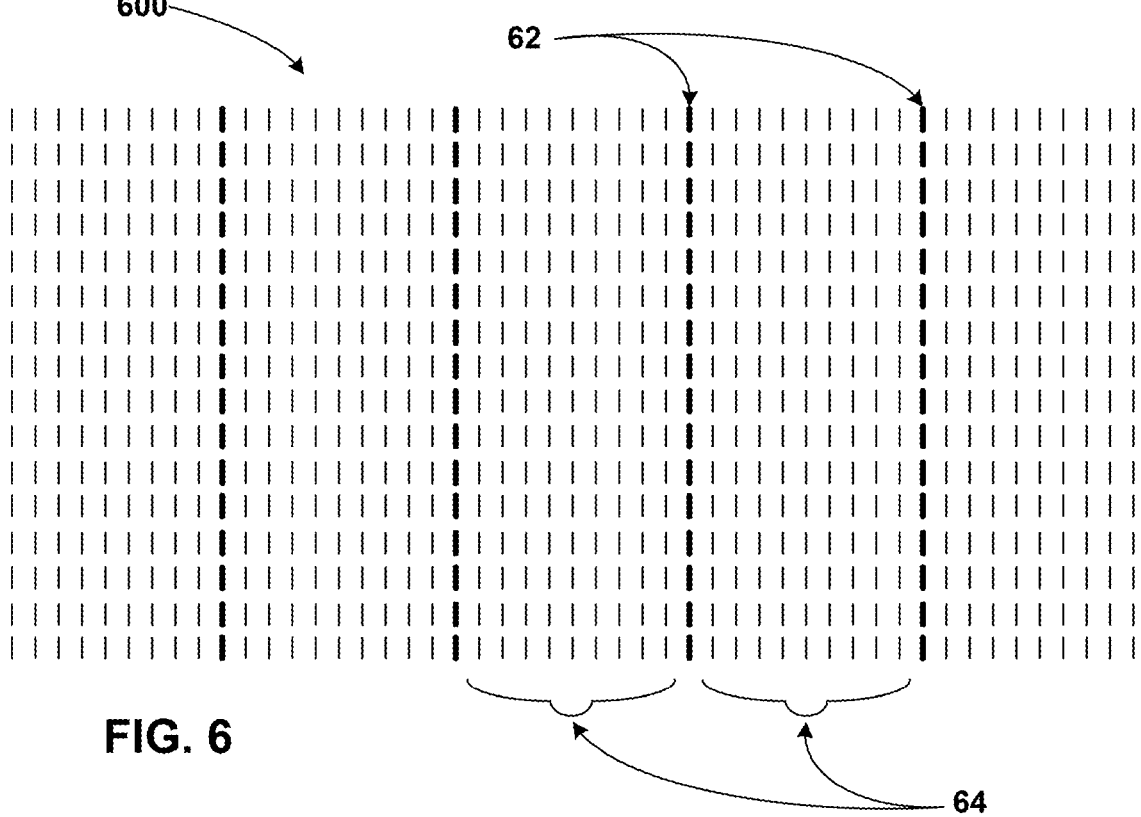
FIG. 6 is a conceptual diagram showing example chip layouts of semiconductor trenches consistent with two different MOSFET devices of this disclosure being formed in the same semiconductor material.

FIG. 6 is a conceptual diagram showing an example chip layout of semiconductor trenches consistent with a dual gate MOSFET device that includes both first MOSFET 22 and second MOSFET 24 formed in the same silicon material 250, consistent with this disclosure. Device 600 of FIG. 6 may generally correspond to both first MOSFET 22 and second MOSFET 24 formed in the same silicon material 250, as shown in FIG. 2. Bolded elements 62 correspond to so-called trenches, cells, or other elements that are fabricated in semiconductor material to define current paths associated with first MOSFET 12. Non-bolded elements 64 correspond to trenches, cells, or other elements fabricated in semiconductor material to define current paths associated with second MOSFET 24. The number of elements 64 and the chip surface area associated with elements 64 is greater than the volume and chip surface area associated with elements 62. The pitch (e.g., the distance left to right) between elements 64, for example may be approximately 1-5 microns. In contrast, the pitch between elements 62 (e.g., the distance left to right) between elements 42 may be approximately 10-50 microns. Transistors created for linear operation, e.g., so-called LIN-FETs may utilize substantial surface area of silicon for heat sinking capabilities. By reusing the area associated with elements 64 as a heat sink when operating a transistor associated with elements 62, device 600 can serve multiple purposes with an efficient use of semiconductor material. Elements 64 comprise cells or trenches associated with a second MOSFET 24 that is configured as an ON-FET capable of delivering large amounts of current. The surface area associated with elements 64, however, may also operate as a heat sink for first MOSFET 22 associated with elements 62, which can achieve linear operational functionality for first MOSFET 22. In some cases, one or more driver circuits may be configured to ensure that second MOSFET 24 is never operated in an ON state at the same time of linear operation of first MOSFET 22, which can preserve the complementary operation and complimentary heat sinking capabilities associated with the surface area of device 600.

FIG. 3 is another circuit diagram showing an example power module package 30 consistent with this disclosure. In this example, power module package 30 comprises a first MOSFET 32, a second MOSFET 34, and a third MOSFET 36. Power module package 30 is substantially similar to power module package 10 and power module package 20 in many respects, and therefore, the similar details will not be repeated. In general, first MOSFET 32 of FIG. 2 is similar to first MOSFET 12 of FIG. 1, second MOSET 34 is similar to second MOSFET 14, and third MOSFET 36 is similar to third MOSFET 16. Molding compound 38 of FIG. 2 is similar to molding compound 18 of FIG. 1, and various pins 302, 304, 306, 308, 310, 312, and 314 are similar respectively to pins 102, 104, 106, 108, 110, 112, and 114.

In contrast to power module package 10 shown in FIG. 1 and power module package 20 shown in FIG. 2, in power module package 30 shown in FIG. 3, first MOSFET 32, second MOSFET 34, and third MOSFET 36 are all formed in a common semiconductor material 350. In this example, first MOSFET 32 and third MOSFET may comprise less than 30 percent of a semiconductor area associated with the common semiconductor material and second MOSFET 34 may comprise greater than 70 percent of the semiconductor area associated with the common semiconductor material.

Forming first MOSFET 32, second MOSFET 34, and third MOSFET 36 in the same semiconductor material 350 may present advantages similar to those described above with reference to FIG. 6. In this example, however, third MOSFET 36 layout in the same semiconductor material 350 is configured with a separate source contact for third MOSFET 36 relative to the source contact of first MOSFET 32 and second MOSFET 34. For this case, rather than trenches, as conceptually shown in FIG. 6, third MOSFET 36 may be formed via islands in semiconductor material 350, while first MOSFET 32 and second MOSFET 34 are formed in trenches similar to the example shown in FIG. 6. The same semiconductor material 350, may comprise silicon, silicon carbide, gallium nitride, or other semiconductor materials.

Figures 4A, 4B:
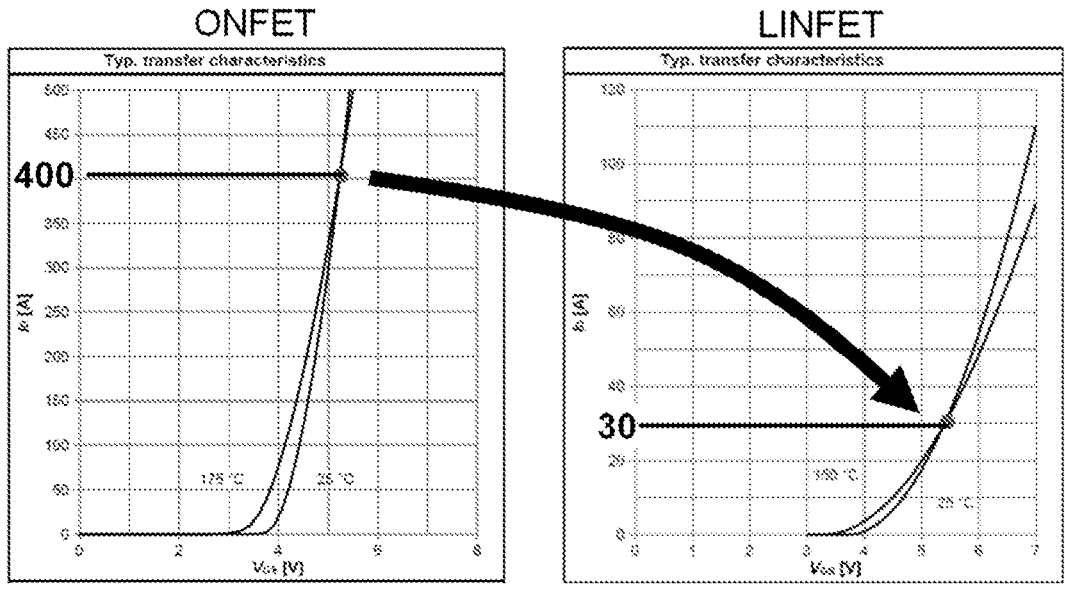
FIGS. 4A and 4B are graphs showing different exemplary transfer characteristics of two different transistors of a circuit package consistent with this disclosure.

FIGS. 4A and 4B are graphs showing different exemplary transfer characteristics of two different transistors, e.g., first MOSFET device 12, 22, 32 relative to a second MOSFET 14, 24, 34. FIG. 4A shows example transfer characteristics associated with a so-called ON-FET which may correspond to second MOSFET 14, 24, 34. As shown in FIG. 4A, current rises very quickly (e.g., exponentially) as a function of gate to source voltage (V G s) and as a function of different temperatures. In contrast, FIG. 4B shows example transfer characteristics associated with a so-called LIN-FET which may correspond to first MOSFET 12, 22, 32. As shown in FIG. 4B, current rises more flat manner (relative to the example in FIG. 4A) as a function of gate to source voltage ($V_{GS}$) and as a function of different temperatures. In other words, the slope of the rise in current shown in FIG. 4B associated with first MOSFET 12, 22, 32 is flat relative to a steeper slope of current rise shown in FIG. 4A associated with second MOSFET 14, 24, 34. Moreover, the ZTCs associated with first MOSFET 12, 22, or 32 and with second MOSFET 14, 24, or 34 are different. As shown in FIG. 4B, for example, the ZTC associated with first MOSFET 12, 22, or 32 may be approximately 30 Amps. In contrast, as shown in FIG. 4A, the ZTC associated with second MOSFET 14, 24, or 34 may be approximately 400 Amps.

Figures 5A, 5B:
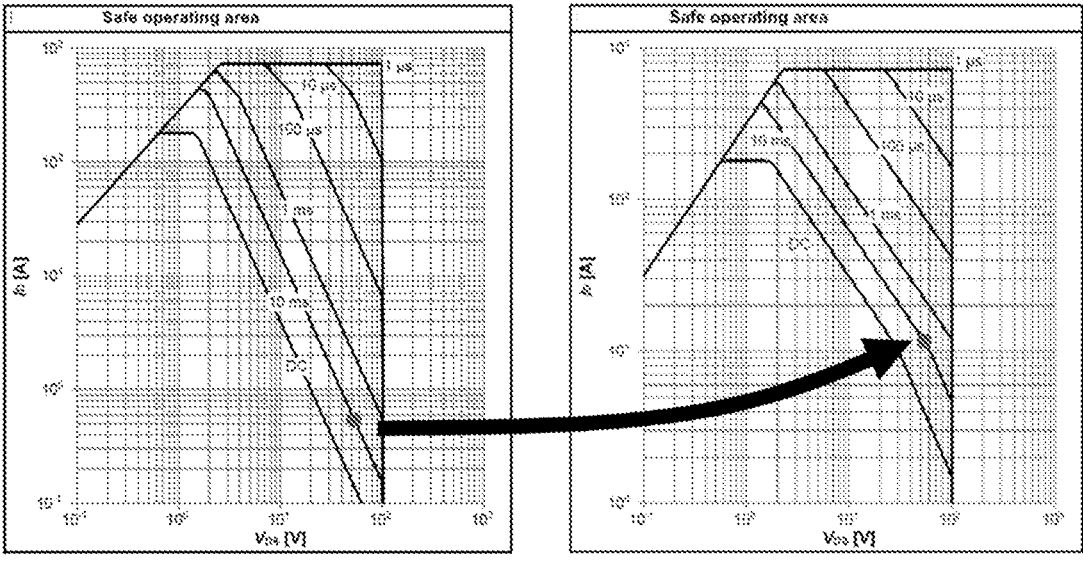
FIGS. 5A and 5B are graphs showing different exemplary safe operating areas (SOAs) of two different transistors of a circuit package consistent with this disclosure.

FIGS. 5A and 5B are graphs showing different exemplary SOAs of two different transistors, e.g., first MOSFET device 12, 22, 32 relative to a second MOSFET 14, 24, 34. FIG. 5A shows example SOA associated with a so-called ON-FET which may correspond to second MOSFET 14, 24, or 34. In contrast, FIG. 5B shows example SOA associated with a so-called LIN-FET which may correspond to second MOS-FET 12, 22, or 32. As can be seen FIG. 5B relative to FIG. 5A, the SOA associated with first MOSFET 12, 22, 32 is significantly larger than the SOA associated with second MOSFET 14, 24, 34, which may enable linear operation modes for first MOSFET 12, 22, 32 within its SOA.

In some examples, first MOSFEET 12, 22, 32 operates in a current-limited manner when operating above a drain-to-source voltage corresponding to the $R_{DS}ON$ of first MOSFET 12, 22, 32 and below a maximum drain-to-source voltage allowed for first MOSFEET 12, 22, 32. In this manner, using first MOSFET 12, 22, 32, current can be kept generally constant when operating above a drain-to-source voltage corresponding to the $R_{DS}ON$ of first MOSFEET 12, 22, 32 and below the maximum drain-to-source voltage allowed for first MOSFEET 12, 22, 32.

Automated driving or other safety critical applications may require fail-safe operation. For connecting and disconnecting different power supply domains, high current switches are often needed with over-current protection and clamping function (linear mode) for dissipating energy stored in wires. In some cases, these MOSFETs are needed in parallel to support the required current level.

Power module switches may need to assure the availability of a safe supply for different electronic control units (ECUs) in an automobile and the freedom of interference between different branches of the safe supply network. Because the current in some branches is very high, it is often desirable to use several switches in parallel.

On top of that, power module switches often have the additional task to pre-charge output capacitors before fully switching on. As the power distribution is a safety element in some applications, a high diagnostic coverage may need to be assured, thereby assuring that single power switches are still working correctly. For this diagnostic coverage it is desirable to measure the load current at each MOSFETs as well as the junction temperature (Tj) of each MOSFET.

In some examples, power module switches may need provide the following features:

a. Low Ron resistance in On Phase to allow low conduction losses at high currents
   b. Linear operation mode with improved SOA to allow pre-charging of capacitors and switching off of inductive loads
   c. Current sense feature for individual current measurement
   d. Individual temperature sensing In addition to these features, power module switches often have the additional task to pre-charge output capacitors. Output capacitors on the output node may comprise so-called DC link capacitors, which can help eliminate current dips when high current power switches are turned on. For this, it may be useful to use dual gate MOSFETs to allow a high power dissipation during switching of the inductive load without leaving the SOA of the device. Alternatively an additionally, a pre-charging circuit can be used to charge output capacitor and transient voltage suppression (TVS) diodes can be used to dissipate the inductive energy.

Temperature diagnostics may be performed by negative temperature coefficient (NTC) thermistors. Alternatively, there are MOSFETs available with integrated diodes for temperature sensing. The load current through a MOSFET can be measured by shunt resistors or integrated sense cells in the MOSFET.

In some examples, such as that illustrated in FIG. 2, a device may combine current sense cells with a dual gate MOSFET device formed in a common semiconductor material 250, which can be used in linear mode with individual temperature sensing and current sensing. In some examples, an externally available second gate control combined with a way of controlling the available signals may allow different sensing features and operation modes. On top of that the usage of the sense cells for temperature sensing is also a desirable feature.

Some examples of this disclosure may provide a high-power switch solution with only 5 pins (or 6 pins with Source/Kelvin contact included) to fulfilling all application requirements Low resistance in on state for high current capability Can be operated in linear mode Allows device specific current measurements Allows device specific temperature sensing The 5 pins may correspond to pins 102, 106, 110, 112, and 104, with the sixth (optional pin) corresponding to pin 114. Pins 108 and 102 are shown in FIG. 1 for ease of description, but pins 108 and 102 may correspond to the same output pin associated with a drain node. Also, in different examples, pins 104 and 114 may correspond to the same pin or to separate pins. As the number of used pins is very important in high current packages, the pin reduction is a desirable feature. Including all the mentioned features in one device allows the user to save costs and board area of additional components.

Figure 7:
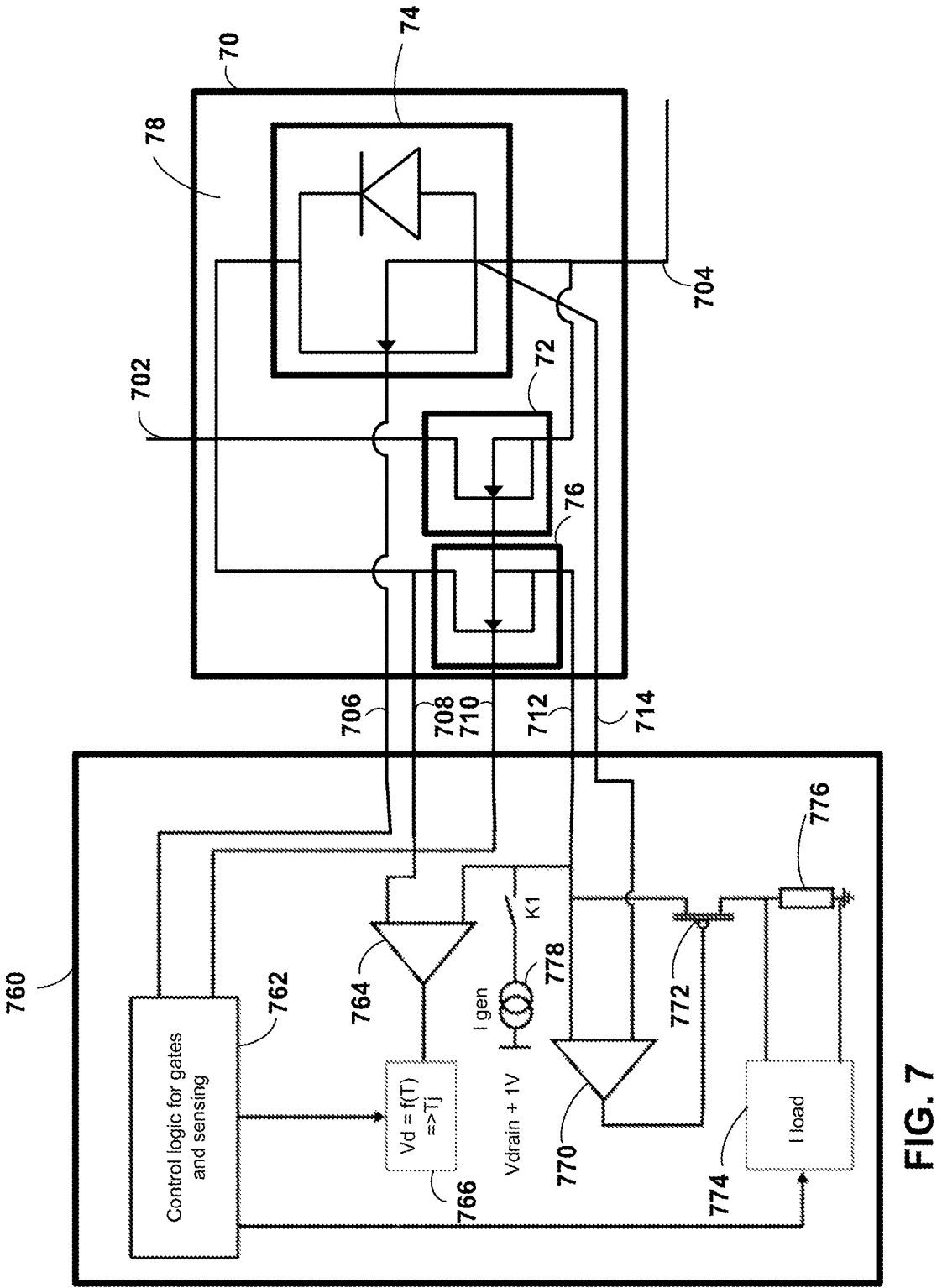
FIG. 7 is a diagram showing an example circuit package and a driver circuit configured to control different transistors of the circuit package according to this disclosure.

FIG. 7 is a diagram showing an example circuit package 70 and a driver circuit 760 configured to control different transistors of circuit package 70 according to this disclosure. Circuit package 70 of FIG. 7 may generally correspond to power module package 10, 20, or 30 of FIGS. 1-3. In general, first MOSFET 72 of FIG. 7 may correspond to first MOSFET 12, 22, or 32 of FIG. 1, 2 or 3. Similarly, second MOSET 74 may correspond to second MOSFET 14, 24, or 34 of FIG. 1, 2, or 3, and third MOSFET 76 may correspond to third MOSFET 16, 26, or 36 of FIG. 1, 2, or 3. Molding compound 78 of FIG. 7 is similar to molding compound 18, 28, or 38 of FIGS. 1, 2, and 3, and various pins 702, 704, 706, 708, 710, 712, and 714 are similar respectively to pins 102, 104, 106, 108, 110, 112, and 114 of FIG. 1, pins 202, 204, 206, 208, 210, 212, and 214 of FIG. 2, or pins 302, 304, 306, 308, 310, 312, and 314 of FIG. 3.

Driver circuit 760 shows one example of a driver circuit configured to control circuit package 70. Control logic 762 may receive commands from a microcontroller (not shown) for controlling the gate pins 706, 710 of MOSFETs 74, 72, and 76. In this example, first gate pin 706 controls the state of MOSFET 74 and second gate pin 710 controls the state of both of MOSFETs 72, 76. In other words, MOSFETs 72 and 76 have a common shared gate node. Pins 708 and 712 are electrically connected to a comparator 764, which can provide a measure of voltage over a body diode of MOSFET 76 in the presence of a bias voltage from current source 778.

In some examples, current source 778 acts as a current source with defined current. The voltage at pin 712 will be higher than 708 but the level may be self-adjusting (in which case it is not Vbat+1 v). In this case, the current through the body diode of MOSFET 76 may be known and the diode forward voltage of MOSFET 76 can be measured with comparator 770. The output of comparator 770 may comprise digital information indicating "Overtemperature yes or no."

In some other examples, current source 778 acts as current source with defined current. The voltage of 712 will be higher than 708 but the level is self adjusting (in which case it is not Vbat+1 v). In this case, the current through the body diode of MOSFET 76 may be known and the diode forward voltage can be buffered with a buffer (such as amplifier 764 acting as a buffer), which can provide analog temperature information. This information could be read by an ADC (not shown in FIG. 7) and provided as analog temperature information or output as digital information (from the ADC) to a microcontroller.

In still other examples, the voltage on pin 712 may be set to Vdrain+1V. In this case, the body diode current through MOSFET 76 can be measured to represent the temperature information. In this situation, it is not necessarily helpful to measure the forward voltage since the forward voltage is fixed to Vdrain+1V. In these or other examples, in some cases, instead of a comparator 764 which provide the information "no overtemperature" or "overtemperature," an analog signal could be used to measure the analog temperature.

In some examples, the measured voltage drop over the body diode can be mapped to a current or to a junction temperature, which may be performed by driver circuit 760 or by an external microcontroller. For example, Vd may be function of junction temperature as shown by element 776. In this way, third MOSFET 76 may be configured as a temperature sensing MOSFET of circuit package 70. In yet additional examples, an additional diode may be added as a temperature sensor instead of the body diode of MOSFET 76. In this case, the additional diode, rather than MOSFET 76 can be used for temperature sensing.

In the example shown in FIG. 7, an amplifier 770 is connected to pins 712 and 714. Pin 714 may correspond to a so-called source Kalvin pin associated with a temperature measurements. Amplifier 770 may be configured to control a PMOS switch 772 so as to cause the source of MOSFET 76 to match the source of MOSFET 74. Then, the current through resistor 776 matches current through MOSFET 74. Element 774 can then measure the voltage drop over resistor 776. This voltage drop over resistor 776 and the resistance of resistor 776 can also provide a measure of the current through resistor 776, which also corresponds to current through MOSFET 74.

Figure 8:
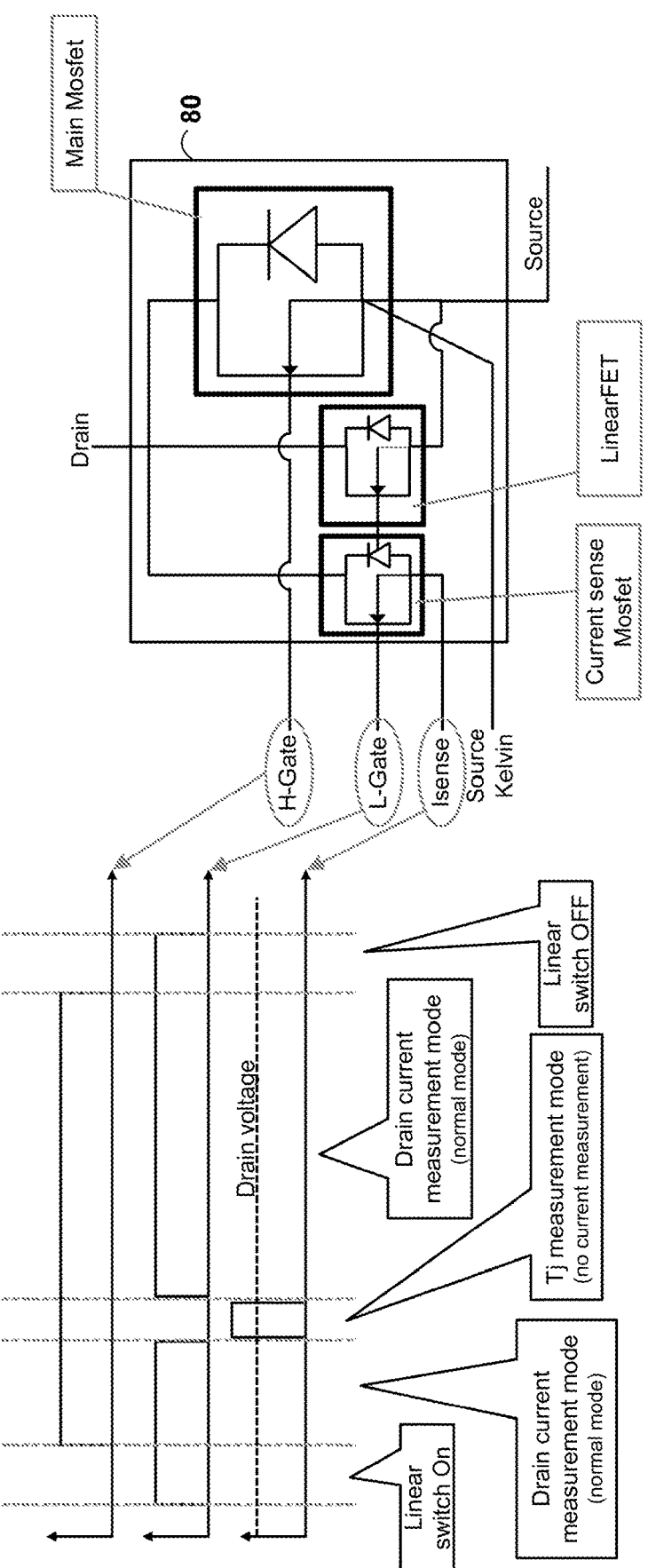
FIG. 8 is a diagram showing a circuit package with multiple transistors and some example control signals for controlling the gates of the transistors according to this disclosure.

FIG. 8 is a diagram showing a circuit package with multiple transistors and some example control signals for controlling the gates of the transistors according to this disclosure. Circuit package 80 of FIG. 8 may generally correspond to power module package 10, 20, or 30 of FIGS. 1-3 or to circuit package 70 of FIG. 7. In general, the Linear FET shown in FIG. 8 may correspond to first MOSFET 12, 22, or 32 of FIG. 1, 2 or 3 or to first MOSFET 72 of FIG. 7. Similarly, the Main MOSFET shown in FIG. 8 may correspond to second MOSFET 14, 24, or 34 of FIG. 1, 2, or 3 or to second MOSFET 74 of FIG. 7. The Current sense MOSFET 76 may correspond to third MOSFET 16, 26, or 36 of FIG. 1, 2, or 3 or to third MOSFET 76 of FIG. 7. The drain pin labeled in FIG. 8 may correspond to pin 102, 202, 302 or 702. The source pin labeled in FIG. 8 may correspond to pin 104, 204, 304, or 704. The H-Gate pin labeled in FIG. 8 may correspond to pin 106, 206, 306, or 706. The L-Gate pin labeled in FIG. 8 may correspond to pin 110, 210, 310, or 710, the Isense pin labeled in FIG. 8 may correspond to pin 112, 212, 312, or 712, and the Source Kalvin pin labeled in FIG. 8 may correspond to pin 114, 214, 314, or 714.

FIG. 8 also illustrates example input signals to circuit package 80 for controlling different modes of circuit package 80. For a linear mode of circuit package 80, a driver circuit may:

Set L-Gate to high and keep H-Gate low: In this mode the robust SOA of circuit package 80 is assured If the Isense is regulated to be equal to the Source voltage, the sense cells can be used to measure the individual load current of the switch For an On-Mode of circuit package 80:

Both gates (e.g., H-Gate and L-Gate) are set to high: Circuit package 80 and the main MOSFET is in full Ron mode and provide a high current capability at low power dissipation.

If the Isense value is regulated to be equal to the Source voltage, the sense cells can be used to measure the individual load current of the switch.

If only the H-Gate is set to high while the L-Gate is set to low and the Isense voltage is increased until a specified current is reached, the temperature of the sense cells associated with the current sense MOSFET can be measured by the forward voltage of the body diode of the current sense MOSFET.

One advantage of this kind of temperature measurement is that a current sensing feature and a temperature sensing feature is combined, and the number of needed pins is reduced compared to a solution where temperature sensing and current sensing are different devices (as would be the case with the use of an extra diode). Pin reduction is generally desirable because the number of pins in high current packages are limited, and additional pins can add costs to the circuit.

In some cases, the forward voltage of the body diode of the sense cells associated with current sense MOSFET may be lowest at the hottest point of the chip. In this case, the measurement result may be dominated by the hottest area of the chip, which is exactly what is desirable to measure. The Source Kalvin contact of the Source of the main MOSFET is optional.

The gate voltages on H-Gate and L-Gate may be defined by a driver circuit, such as driver circuit 760 shown in FIG. 7. Consistent with FIG. 8, the driver circuit may be configured to define a linear mode of operation of circuit package 80 where the first MOSFET (LinearFET) is ON and the second MOSFET (Main MOSFET) is OFF. Moreover, the driver circuit may also be configured to define a high current mode of operation of circuit package 80 where the second MOSFET (Main MOSFET) is ON, and a sensing mode of operation of circuit package 80 during the high current mode of operation where the second MOSFET (Main MOSFET) is ON and the third MOSFET (Current Sense MOSFET) is ON.

In the examples shown in FIGS. 1-3, 7 and 8, the three different transistors of a power module circuit package have a common drain, and the ON-FET and LIN-FET also share a source, while the sensing FET has its own source. The ON-FET may have a first gate pin, while the LIN-FET and the sensing FET share a gate. In other examples, however, it may be desirable to provide separate gate controls of the LIN-FET and the sensing FET.

Figure 9:
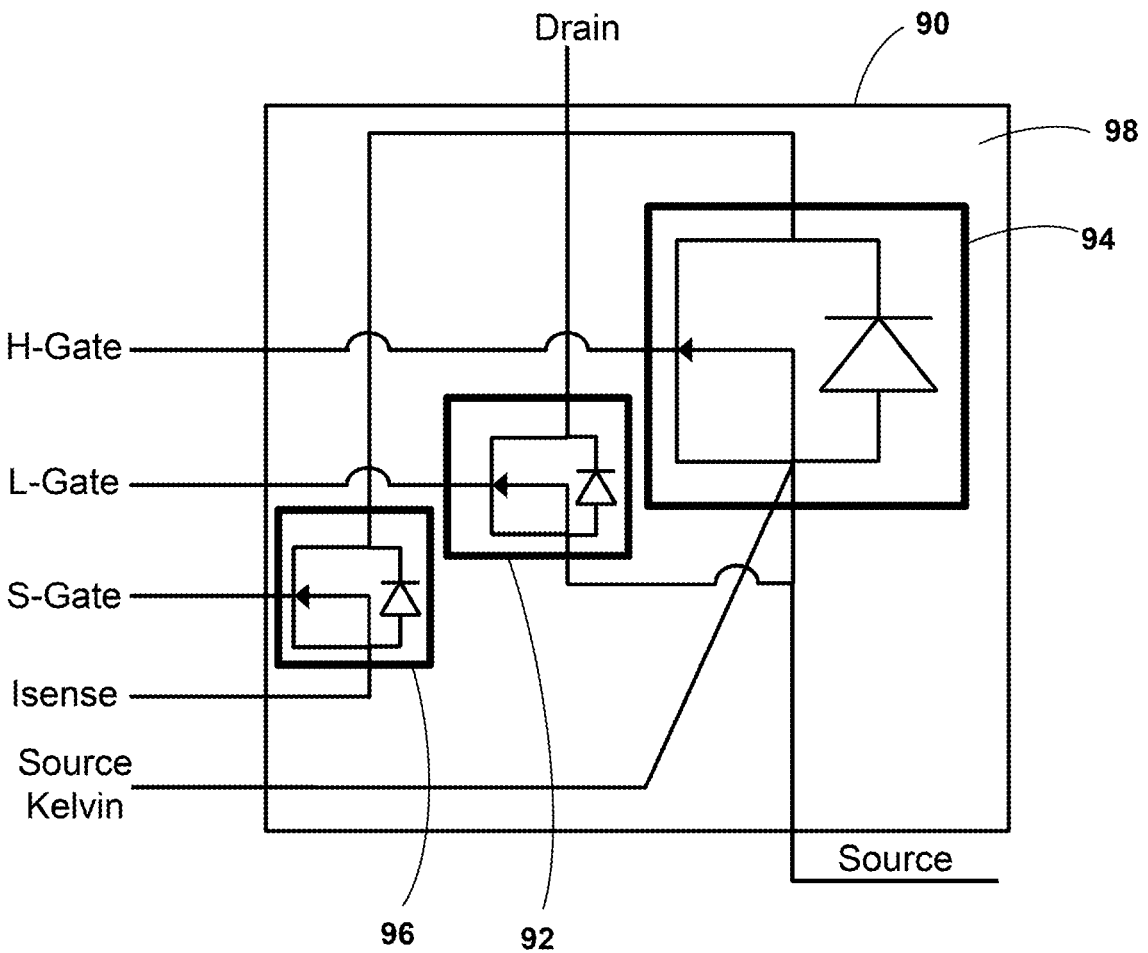
FIGS. 9-11 are circuit diagrams showing some example circuit packages consistent with this disclosure where each of the transistors has a separate gate.
Figure 10:
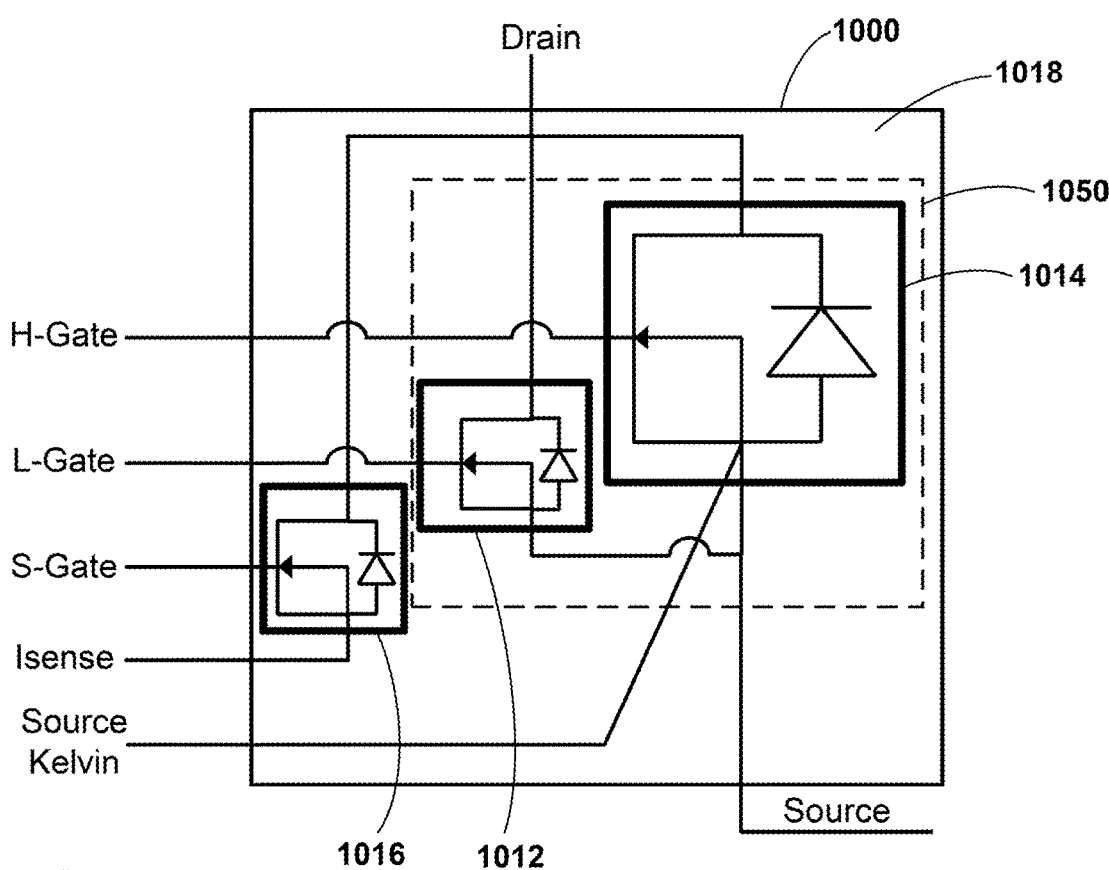
Figure 11:
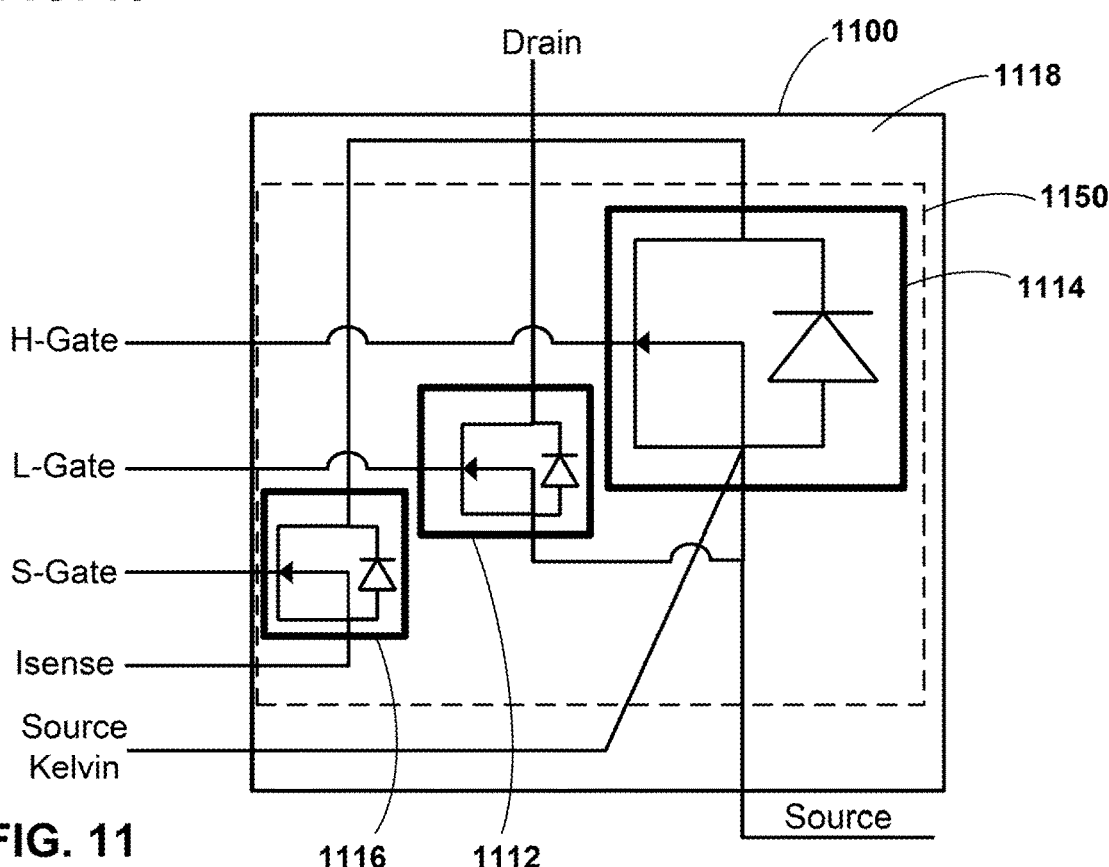

FIGS. 9-11 are circuit diagrams showing some example circuit packages consistent with this disclosure where each of the transistors has a separate gate. This allows the temperature sensing in all times, i.e., even in the time where the main MOSFET is off and only the Linear FET is off or both (i.e., the Main and the Linear FET) are off. An alternative example would be to place yet another extra diode for the temperature measurements. In any case, a driver circuit may provide an I-sense measurement circuit and the capability to lift Isense above the drain voltage in order to measure the forward voltage of the body diode of the sensing MOSFET.

Circuit package 90 of FIG. 9 may generally correspond to power module package 10 of FIG. 1, with the addition of an extra gate pin (S-Gate) for controlling the gate of third MOSFET 96 independently of first MOSFET 92. In general, first MOSFET 92 of FIG. 9 may correspond to first MOSFET 12 FIG. 1. Similarly, second MOSET 94 may correspond to second MOSFET 14 FIG. 1, and third MOSFET 96 may correspond to third MOSFET 16 of FIG. 1. Molding compound 98 of FIG. 9 is similar to molding compound 18 of FIG. 1, and various pins Drain, Source, H-Gate, L-Gate, Isense, and Source Kalvin are similar respectively to pins 102, 104, 106, 110, 112, and 114 of FIG. 1. Unlike FIG. 1, in the example shown in FIG. 9, a separate gate pin (S-Gate) is provided for independent control of third MOSFET 96 such that third MOSFET 96 and first MOSFET 92 are independently controllable. Like FIG. 1, in FIG. 9, first MOSFET 92, second MOSFET 94, and third MOSFET 96 are each discrete transistors formed in separate semiconductor materials and arranged in molding compound 98.

Circuit package 1000 of FIG. 10 may generally correspond to power module package 20 of FIG. 2, with the addition of an extra gate pin (S-Gate) for controlling the gate of third MOSFET 1016 independently of first MOSFET 1012. In general, first MOSFET 1012 of FIG. 10 may correspond to first MOSFET 22 FIG. 2. Similarly, second MOSET 1014 may correspond to second MOSFET 24 FIG. 2, and third MOSFET 1016 may correspond to third MOSFET 26 of FIG. 2. Molding compound 1018 of FIG. 10 is similar to molding compound 28 of FIG. 2, and various pins Drain, Source, H-Gate, L-Gate, Isense, and Source Kalvin are similar respectively to pins 202, 204, 206, 210, 212, and 214 of FIG. 2. Unlike FIG. 2, in the example shown in FIG. 10, a separate gate pin (S-Gate) is provided for independent control of third MOSFET 1016 such that third MOSFET 1016 and first MOSFET 1012 are independently controllable. Like FIG. 2, in FIG. 10, first MOSFET 92 and second MOSFET 94 are formed in the same semiconductor material 1050 (such as described an illustrated in FIG. 6), while third MOSFET 1016 is a discrete transistor formed in a separate semiconductor material and arranged in molding compound 1018.

Circuit package 1100 of FIG. 11 may generally correspond to power module package 30 of FIG. 3, with the addition of an extra gate pin (S-Gate) for controlling the gate of third MOSFET 1116 independently of first MOSFET 1112. In general, first MOSFET 1112 of FIG. 11 may correspond to first MOSFET 32 FIG. 3. Similarly, second MOSET 1114 may correspond to second MOSFET 34 FIG. 3, and third MOSFET 1116 may correspond to third MOSFET 36 of FIG. 3. Molding compound 1118 of FIG. 11 is similar to molding compound 38 of FIG. 3, and various pins Drain, Source, H-Gate, L-Gate, Isense, and Source Kalvin are similar respectively to pins 302, 304, 306, 310, 312, and 314 of FIG. 3. Unlike FIG. 3, in the example shown in FIG. 11, a separate gate pin (S-Gate) is provided for independent control of third MOSFET 1116 such that third MOSFET 1116 and first MOSFET 1112 are independently controllable. Like FIG. 3, in FIG. 11, first MOSFET 1112, second MOSFET 1114, and third MOSFET 1116 are all formed in the same semiconductor material 1150.

Thus, consistent with the examples shown in FIGS. 9-11, a power module package 90, 1000, 1100 may include a first gate pin (labeled L-Gate) associated with a first MOSFET 92, 1012, 1112, wherein the first gate pin is connected to a gate node of the first MOSFET. Power module package 90, 1000, 1100 may also include a second gate pin (labeled H-Gate) associated with a second MOSFET 94, 1014, 1114, wherein the second gate pin is connected to a gate node of the second MOSFET, and power module package 90, 1000, 1100 may also include a third gate pin (labeled S-Gate)

associated with a third MOSFET 96, 1016, 1116, wherein the third gate pin is connected to a gate node of the second MOSFET.

Consistent with the circuit packages described herein, in some examples, one or more driver circuits (e.g., driver circuit 760) may be configured to control the first MOSFET (e.g., the LIN-FET) according to a pre-charging routine to pre-charge a capacitor such as s DC link capacitor. Then, following the pre-charging routine, the one or more driver circuits may be configured to control the second MOSFET (e.g., the ON-FET) to turn on the second MOSFET in the presence of the pre-charge on the capacitor. This can help ensure fast switching of the second MOSFET without significant current dips at the turn-on.

Some aspects of this disclosure describe the combination of individual temperature and current sensing features of a main MOSFET with additional features of a Linear FET feature all in one package. In other words, ON-FET, LIN-FET and sensing FET capabilities are all combined into on circuit package. Other aspects of this disclosure concern the use of sense cells in a dual gate linear MOSFET, which can allow temperature sensing as well and the associated external control signals, which may be facilitated by the external availability of both the gate and source of the sensing MOSFET. The concepts may apply independently if the external available gate signal is separated for the sense FET and the linear FET, or if it is combined.

Figure 12:
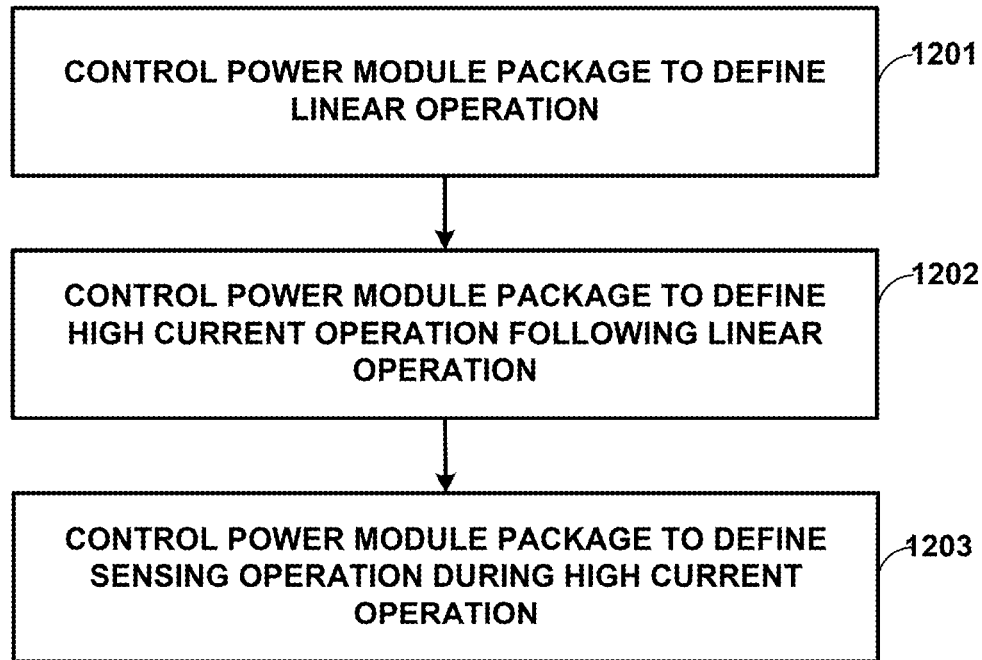
FIG. 12 is a flow diagram illustrating a method of controlling transistors of the circuit package according to this disclosure.

FIG. 12 is a flow diagram illustrating a method of controlling transistors of the circuit package according to this disclosure. As shown in FIG. 12, one or more driver circuits may control a power module package 10, 20, 30, 70, 80, 90, 1000, 1100 to define linear operation (1201). The one or more driver circuits may also control the power module package 10, 20, 30, 70, 80, 90, 1000, 1100 to define high current operation following the linear operation (1202). Again, this may involve one or more driver circuits (e.g., driver circuit 760) controlling the first MOSFET (e.g., the LIN-FET) according to a pre-charging routine to pre-charge a capacitor such as s DC link capacitor. Then, following the pre-charging routine, the one or more driver circuits may be configured to control the second MOSFET (e.g., the ON-FET) to turn on the second MOSFET in the presence of the pre-charge on the capacitor. This can help ensure fast switching of the second MOSFET without significant current dips at the turn-on. Moreover, in addition to linear and high current operation, the one or more driver circuits may also be configured to control the power module package 10, 20, 30, 70, 80, 90, 1000, 1100 to define a sensing operation during the high current operation. In some examples, the sensing operation may leverage the body diode of the sensing transistor as a current sensor in the presence of a bias voltage on the source of the sensing transistor that is higher than the drain voltage of the sensing transistor.

The following clauses may illustrate one or more aspects of the disclosure.

Clause 1—A power module package comprising: a first MOSFET, wherein the first MOSFET is configured to operate in a linear mode of operation when the first MOSFET is ON; a second MOSFET, wherein the second MOSFET is configured to operate in a non-linear mode of operation when the second MOSFET is ON, and wherein the first MOSFET and the second MOSFET are arranged in parallel; and a third MOSFET, wherein the third MOSFET is arranged to perform one or more sensing operations.

Clause 2—The power module package of clause 1, further comprising: a molding compound, wherein the first MOS-FET is arranged within the molding compound, wherein the second MOSFET is arranged within the molding compound, and wherein the third MOSFET is arranged within the molding compound.

Clause 3—The power module of clause 2, further comprising: one or more drain conductors connected to a drain node of the first MOSFET, connected to a drain node of the second MOSFET, and connected to a drain node of the third MOSFET, wherein the drain node of the first MOSFET, the drain node of the second MOSFET, and the drain node of the third MOSFET comprise a common drain node in the molding compound; one or more first source conductors connected to a source node of the first MOSFET and connected to a source node of the second MOSFET, wherein the source node of the first MOSFET and the source node of the second MOSFET comprise a common source node in the molding compound; and one or more second source conductors connected to a source node of the third MOSFET.

Clause 4—The power module package of clause 2 or 3, further comprising: a first gate pin associated with the first MOSFET and the third MOSFET, wherein the first gate pin is connected to a gate node of the first MOSFET and a gate node of the third MOSFET; and a second gate pin associated with the second MOSFET, wherein the second gate pin is connected to a gate node of the second MOSFET.

Clause 5—The power module package of clause 2 or 3, further comprising: a first gate pin associated with the first MOSFET, wherein the first gate pin is connected to a gate node of the first MOSFET; a second gate pin associated with the second MOSFET, wherein the second gate pin is connected to a gate node of the second MOSFET; and a third gate pin associated with the third MOSFET, wherein the third gate pin is connected to a gate node of the second MOSFET.

Clause 6—The power module package of any of clauses 1-5, wherein the first MOSFET and the second MOSFET define different safe operating areas (SOAs) and wherein the first MOSFET and the second MOSFET define different Zero Temperature Coefficients (ZTCs).

Clause 7—The power module package of any of clauses 2-6, wherein the first MOSFET, the second MOSFET, and the third MOSFET are discrete devices formed in different semiconductor materials and arranged in the molding compound.

Clause 8—The power module package of any of clauses 1-6, wherein the first MOSFET and the second MOSFET are formed in a common semiconductor material, and the third MOSFET comprises a discrete device formed in a different semiconductor material.

Clause 9—The power module package of claim 8, wherein the first MOSFET comprises less than 15 percent of a semiconductor area associated with the common semiconductor material and the second MOSFET comprises greater than 85 percent of the semiconductor area associated with the common semiconductor material.

Clause 10—The power module package of any of clauses 1-6, wherein the first MOSFET, the second MOSFET, and the third MOSFET are formed in a common semiconductor material.

Clause 11—The power module package of clause 10, wherein the first MOSFET and the third MOSFET comprise less than 30 percent of a semiconductor area associated with the common semiconductor material and the second MOS-FET comprises greater than 70 percent of the semiconductor area associated with the common semiconductor material.

Clause 12—A circuit comprising: power module package comprising: a molding compound; a first MOSFET arranged within the molding compound, wherein the first MOSFET is configured to operate in a linear mode of operation when the first MOSFET is ON; a second MOSFET arranged in the molding compound, wherein the second MOSFET is configured to operate in a non-linear mode of operation when the second MOSFET is ON and wherein the first MOSFET and the second MOSFET are arranged in parallel; and a third MOSFET arranged in the molding compound, wherein the third MOSFET is arranged to perform one or more sensing operations; and one or more driver circuits configured to control the first MOSFET, the second MOSFET, and the third MOSFET based on gate voltage signals.

Clause 13—The circuit of claim 12, wherein the gate voltage signals from the driver circuit are configured to define: a linear mode of operation where the first MOSFET is ON and the second MOSFET is OFF; a high current mode of operation where the second MOSFET is ON; and a sensing mode of operation during the high current mode of operation where the second MOSFET is ON and the third MOSFET is ON.

Clause 14—The circuit of clause 12 or 13, wherein the power module package further comprises: one or more drain conductors connected to a drain node of the first MOSFET, connected to a drain node of the second MOSFET, and connected to a drain node of the third MOSFET, wherein the drain node of the first MOSFET, the drain node of the second MOSFET, and the drain node of the third MOSFET comprise a common drain node in the molding compound; one or more first source conductors connected to a source node of the first MOSFET and connected to a source node of the second MOSFET, wherein the source node of the first MOSFET and the source node of the second MOSFET comprise a common source node in the molding compound; and one or more second source conductors connected to a source node of the third MOSFET.

Clause 15—The circuit of any of clauses 12-14, wherein the power module package further comprises: a first gate pin associated with the first MOSFET and the third MOSFET, wherein the first gate pin is connected to a gate node of the first MOSFET and a gate node of the third MOSFET; and a second gate pin associated with the second MOSFET, wherein the second gate pin is connected to a gate node of the second MOSFET, wherein the gate voltage signals are configured to control the first MOSFET OFF in the sensing mode.

Clause 16—The circuit of any of clauses 12-14, wherein the power module package further comprises: a first gate pin associated with the first MOSFET, wherein the first gate pin is connected to a gate node of the first MOSFET; a second gate pin associated with the second MOSFET, wherein the second gate pin is connected to a gate node of the second MOSFET; and a third gate pin associated with the third MOSFET, wherein the third gate pin is connected to a gate node of the second MOSFET.

Clause 17—The circuit of any of clauses 12-16, wherein one or more driver circuits are configured to control the first MOSFET according to a pre-charging routine to pre-charge a capacitor, wherein following the pre-charging routine, the one or more driver circuits are configured to control the second MOSFET to turn on the second MOSFET in the presence of the pre-charge on the capacitor.

Clause 18—A method comprising: controlling a plurality of transistors of a power module package via gate signals, wherein the power module package comprises: a first MOSFET, wherein the first MOSFET is configured to operate in a linear mode of operation when the first MOSFET is ON; a second MOSFET, wherein the second MOSFET is configured to operate in a non-linear mode of operation when the second MOSFET is ON, and wherein the first MOSFET and the second MOSFET are arranged in parallel; and a third MOSFET, wherein the third MOSFET is arranged to perform one or more sensing operations.

Clause 19—The method of clause 18, wherein the power module package further comprises: a molding compound, wherein the first MOSFET is arranged within the molding compound, wherein the second MOSFET is arranged within the molding compound, and wherein the third MOSFET is arranged within the molding compound.

Clause 20—The method of clause 18 or 19, wherein controlling the plurality of transistors comprises: controlling the first MOSFET ON and the second MOSFET OFF to define a linear mode of operation of the power module package; controlling the second MOSFET ON to define a high current mode of operation; and controlling the second MOSFET ON and the third MOSFET ON during the high current mode of operation to perform a sensing mode of operation during the high current mode of operation.

Clause 21—The method of clause 19 or 20, wherein the power module package further comprises: one or more drain conductors connected to a drain node of the first MOSFET, connected to a drain node of the second MOSFET, and connected to a drain node of the third MOSFET, wherein the drain node of the first MOSFET, the drain node of the second MOSFET, and the drain node of the third MOSFET comprise a common drain node in the molding compound; one or more first source conductors connected to a source node of the first MOSFET and connected to a source node of the second MOSFET, wherein the source node of the first MOSFET and the source node of the second MOSFET comprise a common source node in the molding compound; and one or more second source conductors connected to a source node of the third MOSFET.

Clause 22—The method of any of clauses 19-21, wherein the power module package further comprises: a first gate pin associated with the first MOSFET and the third MOSFET, wherein the first gate pin is connected to a gate node of the first MOSFET and a gate node of the third MOSFET; and a second gate pin associated with the second MOSFET, wherein the second gate pin is connected to a gate node of the second MOSFET, wherein the gate voltage signals are configured to control the first MOSFET OFF in the sensing mode, the method further comprising: controlling the first and third MOSFETs via the first gate pin; and controlling the second MOSFET via the second gate pin.

Clause 23—The method of any of clauses 19-21, wherein the power module package further comprises: a first gate pin associated with the first MOSFET, wherein the first gate pin is connected to a gate node of the first MOSFET; a second gate pin associated with the second MOSFET, wherein the second gate pin is connected to a gate node of the second MOSFET; and a third gate pin associated with the third MOSFET, wherein the third gate pin is connected to a gate node of the second MOSFET, the method further comprising: controlling the first MOSFETs via the first gate pin; controlling the second MOSFET via the second gate pin; and controlling the third MOSFET via the third gate pin.

Various devices, circuits, methods, and features have been described in this disclosure. These and other devices, circuits, methods and features are within the scope of the following claims.

The invention claimed is:

1. A power module package comprising:
a first metal oxide semiconductor field effect transistor (MOSFET), wherein the first MOSFET is configured to operate in a linear mode of operation when the first MOSFET is ON;
a second MOSFET, wherein the second MOSFET is configured to operate in a non-linear mode of operation when the second MOSFET is ON, and wherein the first MOSFET and the second MOSFET are arranged in parallel;
a third MOSFET, wherein the third MOSFET is arranged to perform one or more sensing operations;
a molding compound, wherein the first MOSFET is arranged within the molding compound, wherein the second MOSFET is arranged within the molding compound, and wherein the third MOSFET is arranged within the molding compound
one or more drain conductors connected to a drain node of the first MOSFET, connected to a drain node of the second MOSFET, and connected to a drain node of the third MOSFET, wherein the drain node of the first MOSFET, the drain node of the second MOSFET, and the drain node of the third MOSFET comprise a common drain node in the molding compound;
one or more first source conductors connected to a source node of the first MOSFET and connected to a source node of the second MOSFET, wherein the source node of the first MOSFET and the source node of the second MOSFET comprise a common source node in the molding compound; and
one or more second source conductors connected to a source node of the third MOSFET.

2. The power module package of claim 1, further comprising:
a first gate pin associated with the first MOSFET and the third MOSFET, wherein the first gate pin is connected to a gate node of the first MOSFET and a gate node of the third MOSFET; and
a second gate pin associated with the second MOSFET, wherein the second gate pin is connected to a gate node of the second MOSFET.

3. The power module package of claim 1, further comprising:
a first gate pin associated with the first MOSFET, wherein the first gate pin is connected to a gate node of the first MOSFET;
a second gate pin associated with the second MOSFET, wherein the second gate pin is connected to a gate node of the second MOSFET; and
a third gate pin associated with the third MOSFET, wherein the third gate pin is connected to a gate node of the second MOSFET.

4. The power module package of claim 1, wherein the first MOSFET and the second MOSFET define different safe operating areas (SOAs) and wherein the first MOSFET and the second MOSFET define different Zero Temperature Coefficients (ZTCs).

5. The power module package of claim 1, wherein the first MOSFET, the second MOSFET, and the third MOSFET are discrete devices formed in different semiconductor materials and arranged in the molding compound.

6. The power module package of claim 1, wherein the first MOSFET and the second MOSFET are formed in a common semiconductor material, and the third MOSFET comprises a discrete device formed in a different semiconductor material.

7. The power module package of claim 6, wherein the first MOSFET comprises less than 15 percent of a semiconductor area associated with the common semiconductor material and the second MOSFET comprises greater than 85 percent of the semiconductor area associated with the common semiconductor material.

8. The power module package of claim 1, wherein the first MOSFET, the second MOSFET, and the third MOSFET are formed in a common semiconductor material.

9. The power module package of claim 8, wherein the first MOSFET and the third MOSFET comprise less than 30 percent of a semiconductor area associated with the common semiconductor material and the second MOSFET comprises greater than 70 percent of the semiconductor area associated with the common semiconductor material.

10. A circuit comprising:
power module package comprising:
a molding compound;
a first metal oxide semiconductor field effect transistor (MOSFET) arranged within the molding compound, wherein the first MOSFET is configured to operate in a linear mode of operation when the first MOSFET is ON;
a second MOSFET arranged in the molding compound, wherein the second MOSFET is configured to operate in a non-linear mode of operation when the second MOSFET is ON and wherein the first MOSFET and the second MOSFET are arranged in parallel;
a third MOSFET arranged in the molding compound, wherein the third MOSFET is arranged to perform one or more sensing operations; and
one or more driver circuits configured to control the first MOSFET, the second MOSFET, and the third MOSFET based on gate voltage signals,
wherein the gate voltage signals from the driver circuit are configured to define:
a linear mode of operation where the first MOSFET is ON and the second MOSFET is OFF;
a high current mode of operation where the second MOSFET is ON; and
a sensing mode of operation during the high current mode of operation where the second MOSFET is ON and the third MOSFET is ON.

11. The circuit of claim 10, wherein the power module package further comprises:
one or more drain conductors connected to a drain node of the first MOSFET, connected to a drain node of the second MOSFET, and connected to a drain node of the third MOSFET, wherein the drain node of the first MOSFET, the drain node of the second MOSFET, and the drain node of the third MOSFET comprise a common drain node in the molding compound;
one or more first source conductors connected to a source node of the first MOSFET and connected to a source node of the second MOSFET, wherein the source node of the first MOSFET and the source node of the second MOSFET comprise a common source node in the molding compound; and
one or more second source conductors connected to a source node of the third MOSFET.

12. The circuit of claim 10, wherein the power module package further comprises:
a first gate pin associated with the first MOSFET and the third MOSFET, wherein the first gate pin is connected to a gate node of the first MOSFET and a gate node of the third MOSFET; and a second gate pin associated with the second MOSFET, wherein the second gate pin is connected to a gate node of the second MOSFET, wherein the gate voltage signals are configured to control the first MOSFET OFF in the sensing mode.

13. The circuit of claim 10, wherein the power module package further comprises:

a first gate pin associated with the first MOSFET, wherein the first gate pin is connected to a gate node of the first MOSFET;

a second gate pin associated with the second MOSFET, wherein the second gate pin is connected to a gate node of the second MOSFET; and a third gate pin associated with the third MOSFET, wherein the third gate pin is connected to a gate node of the second MOSFET.

14. The circuit of claim 10, wherein one or more driver circuits are configured to control the first MOSFET according to a pre-charging routine to pre-charge a capacitor, wherein following the pre-charging routine, the one or more driver circuits are configured to control the second MOSFET to turn on the second MOSFET in the presence of the pre-charge on the capacitor.

15. A method comprising:

controlling a plurality of transistors of a power module package via gate signals, wherein the power module package comprises:

a first metal oxide semiconductor field effect transistor (MOSFET), wherein the first MOSFET is configured to operate in a linear mode of operation when the first MOSFET is ON;

a second MOSFET, wherein the second MOSFET is configured to operate in a non-linear mode of operation when the second MOSFET is ON, and wherein the first MOSFET and the second MOSFET are arranged in parallel; and a third MOSFET, wherein the third MOSFET is arranged to perform one or more sensing operations, wherein controlling the plurality of transistors comprises:

controlling the first MOSFET ON and the second MOSFET OFF to define a linear mode of operation of the power module package;

controlling the second MOSFET ON to define a high current mode of operation; and controlling the second MOSFET ON and the third MOSFET ON during the high current mode of operation to perform a sensing mode of operation during the high current mode of operation.

16. The method of claim 15, wherein the power module package further comprises:

a molding compound, wherein the first MOSFET is arranged within the molding compound, wherein the second MOSFET is arranged within the molding compound, and wherein the third MOSFET is arranged within the molding compound.

17. The method of claim 16, wherein the power module package further comprises:

one or more drain conductors connected to a drain node of the first MOSFET, connected to a drain node of the second MOSFET, and connected to a drain node of the third MOSFET, wherein the drain node of the first MOSFET, the drain node of the second MOSFET, and the drain node of the third MOSFET comprise a common drain node in the molding compound;

one or more first source conductors connected to a source node of the first MOSFET and connected to a source node of the second MOSFET, wherein the source node of the first MOSFET and the source node of the second MOSFET comprise a common source node in the molding compound; and one or more second source conductors connected to a source node of the third MOSFET.

18. The method of claim 17, wherein the power module package further comprises:

a first gate pin associated with the first MOSFET and the third MOSFET, wherein the first gate pin is connected to a gate node of the first MOSFET and a gate node of the third MOSFET; and a second gate pin associated with the second MOSFET, wherein the second gate pin is connected to a gate node of the second MOSFET, wherein the gate voltage signals are configured to control the first MOSFET OFF in the sensing mode, the method further comprising:

controlling the first and third MOSFETs via the first gate pin; and controlling the second MOSFET via the second gate pin.

19. The method of claim 17, wherein the power module package further comprises:

a first gate pin associated with the first MOSFET, wherein the first gate pin is connected to a gate node of the first MOSFET;

a second gate pin associated with the second MOSFET, wherein the second gate pin is connected to a gate node of the second MOSFET; and a third gate pin associated with the third MOSFET, wherein the third gate pin is connected to a gate node of the second MOSFET, the method further comprising:

controlling the first MOSFETs via the first gate pin;

controlling the second MOSFET via the second gate pin; and controlling the third MOSFET via the third gate pin.

20. A power module package comprising:

a first metal oxide semiconductor field effect transistor (MOSFET), wherein the first MOSFET is configured to operate in a linear mode of operation when the first MOSFET is ON;

a second MOSFET, wherein the second MOSFET is configured to operate in a non-linear mode of operation when the second MOSFET is ON, and wherein the first MOSFET and the second MOSFET are arranged in parallel;

a third MOSFET, wherein the third MOSFET is arranged to perform one or more sensing operations, wherein the first MOSFET and the second MOSFET define different safe operating areas (SOAs) and wherein the first MOSFET and the second MOSFET define different Zero Temperature Coefficients (ZTCs).

21. A power module package comprising:

a first metal oxide semiconductor field effect transistor (MOSFET), wherein the first MOSFET is configured to operate in a linear mode of operation when the first MOSFET is ON;

a second MOSFET, wherein the second MOSFET is configured to operate in a non-linear mode of operation when the second MOSFET is ON, and wherein the first MOSFET and the second MOSFET are arranged in parallel;

a third MOSFET, wherein the third MOSFET is arranged to perform one or more sensing operations, wherein the first MOSFET and the second MOSFET are formed in a common semiconductor material, and the third MOSFET comprises a discrete device formed in a different semiconductor material.

22. The power module package of claim 21, wherein the first MOSFET comprises less than 15 percent of a semiconductor area associated with the common semiconductor material and the second MOSFET comprises greater than 85 percent of the semiconductor area associated with the common semiconductor material.

23. A circuit comprising:

power module package comprising:

a molding compound;

a first metal oxide semiconductor field effect transistor (MOSFET) arranged within the molding compound, wherein the first MOSFET is configured to operate in a linear mode of operation when the first MOSFET is ON;

a second MOSFET arranged in the molding compound, wherein the second MOSFET is configured to operate in a non-linear mode of operation when the second MOSFET is ON and wherein the first MOS-FET and the second MOSFET are arranged in parallel;

a third MOSFET arranged in the molding compound, wherein the third MOSFET is arranged to perform one or more sensing operations; and one or more driver circuits configured to control the first MOSFET, the second MOSFET, and the third MOS-FET based on gate voltage signals, wherein one or more driver circuits are configured to control the first MOSFET according to a pre-charging routine to pre-charge a capacitor, wherein following the pre-charging routine, the one or more driver circuits are configured to control the second MOSFET to turn on the second MOSFET in the presence of the pre-charge on the capacitor.

\* \* \* \* \*